United States Patent
Lakshmikumar et al.

(10) Patent No.: US 9,397,687 B2
(45) Date of Patent: Jul. 19, 2016

(54) MONOTONIC SEGMENTED DIGITAL TO ANALOG CONVERTER

(71) Applicant: Cisco Technology, Inc., San Jose, CA (US)

(72) Inventors: Kadaba Lakshmikumar, Basking Ridge, NJ (US); Mark Y. Tse, Basking Ridge, NJ (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 14/991,467

(22) Filed: Jan. 8, 2016

(65) Prior Publication Data

US 2016/0126971 A1    May 5, 2016

Related U.S. Application Data

(63) Continuation of application No. 14/473,340, filed on Aug. 29, 2014, now Pat. No. 9,258,010.

(51) Int. Cl.
| | |
|---|---|
| *H03M 1/66* | (2006.01) |
| *H03M 1/68* | (2006.01) |
| *H03M 1/74* | (2006.01) |
| *H03M 1/00* | (2006.01) |

(52) U.S. Cl.
CPC .............. *H03M 1/68* (2013.01); *H03M 1/002* (2013.01); *H03M 1/747* (2013.01); *H03M 1/00* (2013.01)

(58) Field of Classification Search
CPC ............................... H03M 1/00; H03M 1/747
USPC .......................................... 341/145, 144, 150
See application file for complete search history.

(56) References Cited

U.S. PATENT DOCUMENTS

| | | | |
|---|---|---|---|
| 6,507,304 | B1 | 1/2003 | Lorenz |
| 7,026,971 | B2 | 4/2006 | Horsky et al. |
| 7,679,538 | B2 | 3/2010 | Tsang |
| 2003/0201924 | A1 | 10/2003 | Lakshmikumar et al. |
| 2006/0114142 | A1 | 6/2006 | Ohmi et al. |
| 2012/0161997 | A1* | 6/2012 | Chou .................. H03M 1/0624 341/150 |

OTHER PUBLICATIONS

Chi-Sung Lin et al., A 12 bit 2.9 GS/s DAC with IM3 -60 dBc Beyond 1 GHz in 65 nm CMOS, Dec. 12, 2009, vol. 44, No. 12, IEEE Journal of Solid-State Circuits.
EE247 Lecture 16: Data Converters, Accessed Jun. 13, 2014.
International Search Report and Written Opinion, from PCT/US2015/042363, Nov. 16, 2015, WO.
J.L. Merino et al., A Current Copying Structure for Current-Mode Monotonic Digital-to-Analog Converters, 2006, ISCAS.
(Continued)

*Primary Examiner* — Joseph Lauture
(74) *Attorney, Agent, or Firm* — Lempia Summerfield Katz LLC

(57) ABSTRACT

In one implementation, a digital analog converter (DAC) is monotonic because the output moves only in the direction of the input and segmented because a more significant portion of the DAC is separated from a less significant portion. The DAC receives an input binary word that includes multiple most significant bits and multiple least significant bits. The DAC decodes the input binary word to an intermediate signal that includes a bit width equal to or greater than a bit width of the binary word. The intermediate signal sets output switches and current source switches. The DAC provides an analog output signal that represents the input binary word.

20 Claims, 9 Drawing Sheets

(56) References Cited

OTHER PUBLICATIONS

Kadaba Lakshmikumar et al., Characterization and Modeling of Mismach in MOS Transistors for Precision Analog Design, Dec. 1986, IEEE Journal of Solid-State Circuits.

Roubik Gregorian, Introduction to CMOS OP-AMPS and Comparators, 1999, Wiley-Interscope.

S. Sarkar et al., An 8-bit 1.8 V 500 MS/s CMOS DAC with a Novel Four-Stage Current Steering Architecture, Abstract, May 18-21, 2008, IEEE.org.

Walt Kester, Basic DAC Architectures III: Segmented DACs, 2009, Analog Devices.

* cited by examiner

| Input Value | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| P1  | 0 | 1 | 1 | 1 | 1 | 0 | 0 | 0 | 0 | 0 | 0 | 0 | 0 | 0 | 0 | 0 |
| P2  | 0 | 0 | 0 | 0 | 0 | 1 | 1 | 1 | 1 | 0 | 0 | 0 | 0 | 0 | 0 | 0 |
| P3  | 0 | 0 | 0 | 0 | 0 | 0 | 0 | 0 | 0 | 1 | 1 | 1 | 1 | 0 | 0 | 0 |
| P4  | 0 | 0 | 0 | 0 | 0 | 0 | 0 | 0 | 0 | 0 | 0 | 0 | 0 | 1 | 1 | 1 |
| P5  | 0 | 1 | 1 | 1 | 1 | 1 | 1 | 1 | 1 | 1 | 1 | 1 | 1 | 1 | 1 | 1 |
| P6  | 0 | 0 | 1 | 1 | 1 | 0 | 1 | 1 | 1 | 0 | 1 | 1 | 1 | 0 | 1 | 1 |
| P7  | 0 | 0 | 0 | 1 | 1 | 0 | 0 | 1 | 1 | 0 | 0 | 1 | 1 | 0 | 0 | 1 |
| P8  | 0 | 0 | 0 | 0 | 1 | 0 | 0 | 0 | 1 | 0 | 0 | 0 | 1 | 0 | 0 | 0 |
| P9  | 0 | 0 | 0 | 0 | 0 | 1 | 1 | 1 | 1 | 1 | 1 | 1 | 1 | 1 | 1 | 1 |
| P10 | 0 | 0 | 0 | 0 | 0 | 0 | 0 | 0 | 0 | 1 | 1 | 1 | 1 | 1 | 1 | 1 |
| P11 | 0 | 0 | 0 | 0 | 0 | 0 | 0 | 0 | 0 | 0 | 0 | 0 | 1 | 1 | 1 | 1 |
| P12 | 0 | 0 | 0 | 0 | 0 | 0 | 0 | 0 | 0 | 0 | 0 | 0 | 0 | 0 | 0 | 0 |

MONOTONIC SEGMENTED DIGITAL TO ANALOG CONVERTER

This application is a continuation under 35 U.S.C §120 and 37 CRF §1.53(b) of U.S. patent application Ser. No. 14/473,340 filed Aug. 29, 2014, the disclosure of which is incorporated herein by reference in its entirety.

TECHNICAL FIELD

This disclosure relates in general to the field of digital-to-analog converters, and more particularly, a current steering type segmented and monotonic digital-to-analog converter.

BACKGROUND

A digital to analog converter (DAC) receives a digital input and converts the digital input to a piecewise linear output. Digital signals describe values using discrete quantities. Analog signals describe values using continuous quantities. The digital input may be a binary word comprising one or more binary bits, and with each bit having exactly two possible values (e.g., 0 and 1), whereas the piecewise linear output may have $2^N$ possible values, where N is the number bits in the input binary word. The piecewise linear output may be provided in the form of current, voltage, or another quantity. An analog to digital converter (ADC) performs the reverse function of a DAC.

There are many different DAC architectures. No single architecture is optimal for all applications. Considerations in selecting a DAC architecture for design and implementation include size, power, speed, cost, and accuracy. Two of the important parameters characterizing the accuracy of a DAC are integral non-linearity (INL) and differential non-linearity (DNL). Both of these parameters can be expressed in units of least significant bit (LSB), which is the minimum step size of the DAC. For an N-bit DAC, an LSB is equal to $1/(2^N)$. INL error is defined to be the deviation of the DAC's transfer curve from a straight line. DNL error is defined as the variation in analog step sizes away from 1 LSB. The input-output transfer characteristic of a DAC is ideally a straight line implying a linear behavior. In theory, DACs can be designed to have 0 INL and DNL errors. However, due to non-ideal effects such as statistical mismatches in element values, the actual DAC transfer characteristic after implementation is not linear. That is, either or both INL and DNL errors will be greater than 0 LSB. Most signal processing applications require the DAC to meet a certain INL specification. On the other hand, many applications only require the DNL to be less than 1 LSB. DACs having DNL error less than 1 LSB are guaranteed to be monotonic, i.e., as the input code moves in one direction the output will move in the same direction or in the worst case remains flat.

To ensure monotonicity in a binary-weighted DAC, the value of precision conversion elements (e.g., current, resistor, etc.) must be sufficiently precise and have tight tolerances. Random variation in component values can render the DAC's response non-monotonic. Unfortunately, DAC architectures requiring precisely matched components are very expensive to manufacture. On the other hand, an inherently monotonic architecture does not impose any requirement on the matching accuracy of the conversion elements and is therefore inexpensive to implement and mass produce.

BRIEF DESCRIPTION OF THE DRAWINGS

Example embodiments are described herein with reference to the following drawings.

FIG. 3 illustrates an example lookup table for the decoder of FIG. 2.

DESCRIPTION OF EXAMPLE EMBODIMENTS

Overview

In one implementation, a method includes receiving an input binary word, wherein the binary word includes a plurality of most significant bits and a plurality of least significant bits and decoding the input binary work to an intermediate signal. The intermediate signal includes a bit width equal to or greater than a bit width of the binary word. The method includes setting a plurality of output switches according to the intermediate signal, wherein the plurality of output switches includes a pair of switches for each state of the plurality of most significant bits and a pair of switches for each state of the plurality of least significant bits and setting a plurality of current source switches according to the intermediate signal, wherein the plurality of current source switches includes a pair of switches for each state of the plurality of most significant bits. An analog output signal is provided that represents the input binary word, and the analog output signal is controlled by the plurality of output switches and the plurality of current source switches.

Example Embodiments

DACs are used in a wide variety of applications. All audio applications, including televisions, telephones, computers, music players, and most other consumer electronics must include DACs to convert the digital signals to sound that can be heard by the human ear. Other examples include oscilloscopes, radar systems, video monitors, mobile phones, radios, and microphones.

Another DAC application example is in the area of silicon photonics. Silicon photonics utilizes silicon as an optical medium inside a microchip that drives an electro-optical transponder. The transponder may include a laser source whose light output is a function of its ambient temperature. The microchip may include a DAC in a sense and control loop to control the light output of the laser as temperature changes. For such a control loop to be stable and effective, the DAC should have a monotonic transfer characteristic.

There are transistor-based non-segmented DAC circuits that are inherently monotonic. However, an N-bit non-segmented DAC requires $2^N$ elements controlled by an N-to-$2^N$ thermometric decoder, which imposes size and cost penalties. The following embodiments utilize a unique decoding and current steering scheme to steer current through a network of transistors and switching elements to provide a monotonic DAC circuit that is relatively small in area and inexpensive to manufacture.

Figure 1:
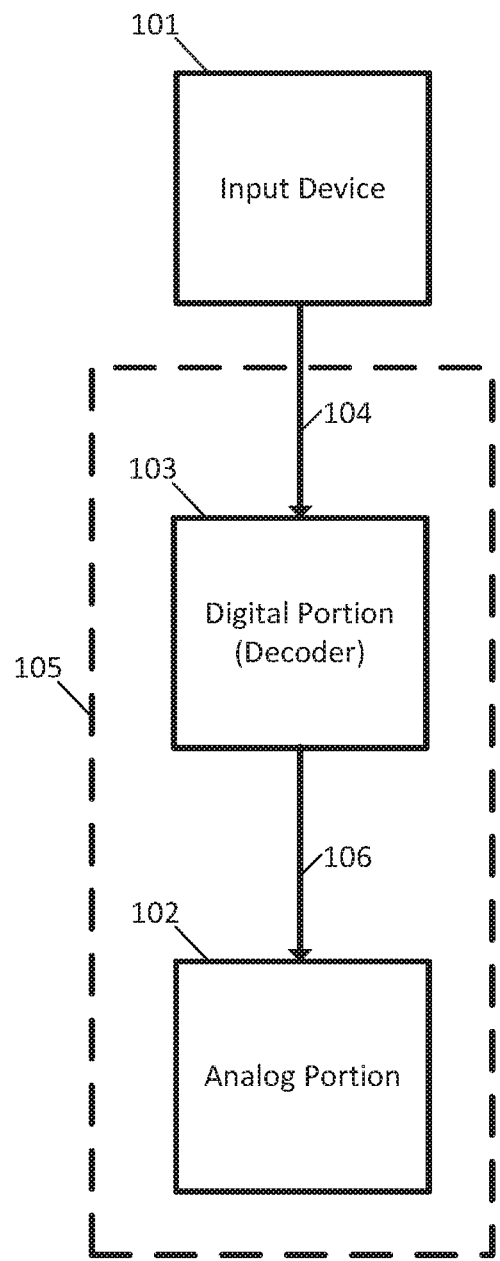
FIG. 1 illustrates an example system including a monotonic segmented digital to analog converter.

FIG. 1 illustrates an example system including a monotonic segmented digital to analog converter that exhibits a monotonic transfer characteristic. The system includes an input device 101 and a DAC 105 including a digital portion 103, and an analog portion 102. Additional, different, or fewer components may be included in the system. The input device 101 provides data to the decoder 103. A communication path 104 between the input device 101 and the decoder 103 may be a conductive path. The conductive path may be a trace on a circuit board. The conductive path may be a wire or cable. The communication path 106 between the decoder 103 and the DAC 105 may be a similar type of conductive path. Alternatively, the communication path 104 may be internal to a microchip including the decoder 103 and the DAC 105.

For a monotonic current steering DAC, the digital portion is primarily a decoder responsible for decoding the digital input word to generate control signals to the analog portion of the DAC to steer current from a set of current sources to the DAC's output in a manner that produces a monotonic transfer characteristic.

In any of these examples, the input device 101 generates digital data and sends the decoded control signals to the analog portion 102 through the decoder 103. The digital data may be organized in binary words having a specific size or number of bits. The specific size may be constant or variable. For a segmented DAC architecture, which carries size advantage, the input binary words may be divided or segmented into a least significant portion including less significant bits and a most significant portion including more significant bits. Accordingly, the analog portion 102 of the DAC 105 is segmented into a more significant portion and a less significant portion.

The DAC 105 is configured to receive an input signal representing a binary word including multiple most significant bits and multiple least significant bits. The decoder 103 converts the input signal to an intermediate signal. For an N-bit DAC that is segmented to M number of bits in the most significant portion, and L number of bits in the least significant portion, where N=M+L and the decoder has $2 \times 2^M + 2^L$ output bits. The value $2^M$ is also the number of current sources and associated current source switches, as well as the number of cascode transistors and switches in the most significant portion of the DAC. The value $2^L$ is the required number of cascode transistors and switches in the least significant portion of the DAC 105. For example, if the input binary word is 4 bits wide, and if the binary word is segmented to have 2 bits in most significant portion and 2 bits in the least significant portion, i.e., M=2 and L=2, then the bit width of the decoder 103 output is $2 \times 2^2 + 2^2 = 12$ bits (e.g., the bit width of the decoder is three times the bit width of the binary word). Four ($2^M$) of these bits are used to control the 4 ($2^M$) current source switches, another four ($2^M$) of these bits are used to control the 4 ($2^M$) switches in the most significant portion of the DAC, and the remaining four ($2^L$) bits are used to control the other 4 ($2^L$) switches in the least significant portion of the DAC.

In another example, if the input binary word is 8 bits wide, and if the binary word is segmented to have 4 bits in most significant portion and 4 bits in the least significant portion, i.e., M=4 and L=4, then the bit width of the decoder 103 output is $2 \times 2^4 + 2^4 = 48$ bits (e.g., the bit width of the decoder is six times the bit width of the binary word). Sixteen ($2^M$) of these bits are used to control the 16 ($2^M$) current source switches, another sixteen ($2^M$) of these bits are used to control the 16 ($2^M$) switches in the most significant portion of the DAC, and the remaining sixteen ($2^L$) bits are used to control the other 16 ($2^L$) switches in the least significant portion of the DAC. Other examples may be calculated similarly.

Figure 2:
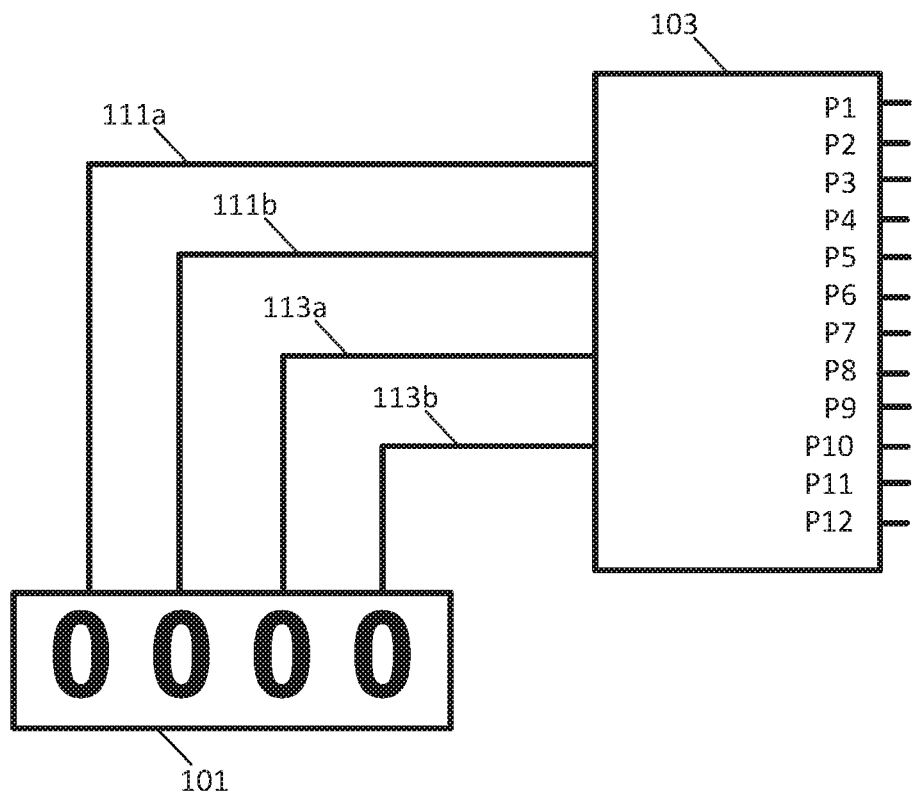
FIG. 2 illustrates an example decoder from the system of FIG. 1.

FIG. 2 illustrates an example digital portion or decoder 103 from the system of FIG. 1. The binary input word from an original digital signal is decoded by decoder 103 to produce the intermediate signal for the analog portion 102 of the DAC 105. The binary input word includes a first more significant bit 111a and a second more significant bit 111b in the most, or more, significant portion and a first less significant bit 113a and a second less least significant bits 113a and 113b in the least, or less, significant portion. The binary word 101 may not be evenly divided between the most significant portion and the least significant portion. For example, a 5-bit DAC may be segmented to include three bits in the more significant portion (M=3) and two bits in the less significant portion (L=2), and vice versa. In general, the input word may be segmented to have any number of bits in the more and less significant portions.

The decoder 103 may be an independent device (e.g., a multiplexer, or a logic circuit including AND gates, OR gates, and NAND gates) or combined with the rest of the DAC 105. In this particular example illustrated in FIG. 2 where N=4, M=2, and L=2, the decoder 103 produces 12 output bits, P1 through P12.

FIG. 3 illustrates an example lookup table (LUT) 110 for the decoder 103 of FIG. 2 that implements a decoding scheme for the M=2, L=2 monotonic and segmented DAC. The 'Input Value' column, i.e., the leftmost column of the LUT 110 lists all 16 possible values for the 4-bit binary words. A four bit binary word has possible decimal values of 0 to 15, as shown by the input value column of the lookup table 110. The lookup table 110 associates data from a unique input signal for each of the binary words. The LUT's output signal is made up of bits P1 to P12. The 12 bits in each row of the table under columns 'P1' thru 'P12' represents the decoded output corresponding to the input value given in the first column.

The LUT 110 may be hardwired in the decoder 103. That is, bits 111a-b and 113a-b (the four input bits) may feed directly into a logic circuit that produces output bits P1 to P12. Alternatively, the decoder 103 may be implemented in firmware which uses the 4-bit input word to query the LUT 110 and receive back from the LUT 110 the decoded output bits.

Figure 4:
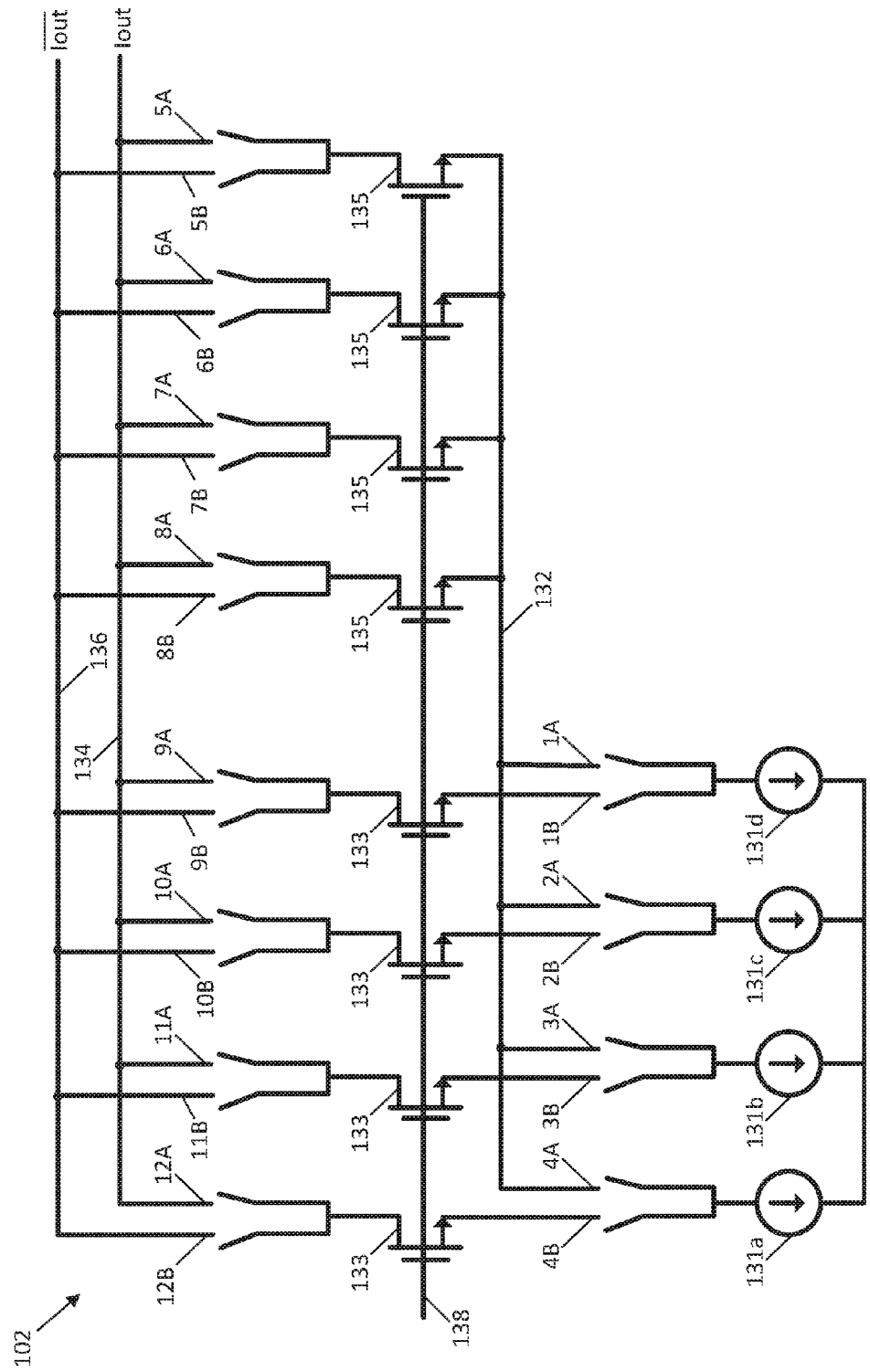
FIG. 4 illustrates an example of an analog portion of a monotonic segmented digital to analog converter.

FIG. 4 illustrates the analog portion 102 of the DAC 105, which is the analog portion of the M=2, L=2 segmented and inherently monotonic DAC. The DAC 105 includes current sources 131a-d, current source switches 1A-B, 2A-B, 3A-B, and 4A-B; cascode transistors 133 and switches 9A-B, 10A-B, 11A-B, and 12A-B for the more significant portion; cascode transistors 135, switches 5A-B, 6A-B, 7A-B, and 8A-B, and least significant bus 132 for the less significant portion; a primary output bus 134, and a complement output bus 136. Additional, different, or fewer components may be included.

The DAC 105 controls the three sets of switches according to the input control signals. Bits P1 to P12 from decoder 103 control switches 1A-B to 12A-B respectively. Specifically, switches 1A-B, 2A-B, 3A-B, and 4A-B, are used for switching current from the current sources 131a-d to the output buses 134 and 136 through transistors 133 and switches 9A-B, 10A-B, 11A-B, 12A-B in the most significant portion, and through transistors 135 and switches 5A-B, 6A-B, 7A-B, 8A-B in the least significant portion of the DAC 105.

In general, the more significant portion switches may include a pair of switches for each state of the plurality of most significant bits, and the less significant portion switches may include a pair of switches for each state of the plurality of the least significant bits. In the present example, the binary word includes two most significant bits (M=2) and two least significant bits (L=2), the most significant portion of DAC 105 therefore includes $2^2$=four pairs of switches (9-12), and the least significant portion also include $2^2$=four pairs of switches (5-8) as shown in FIG. 4. In addition, there are four ($2^2$) pairs of source current switches (1-4).

The switches may be implemented as single-pole-double-throw (SPDT) switches. Each SPDT switch may comprise a common pole contact and two throw contacts. The pole contact may be connected to either of its two throw contacts depending on the state of its input control signal (P1-P12). The less significant portion switches (e.g., switches 5A-B, 6A-B, 7A-B, and 8A-B) include a common connection electrically connected to the drains of transistors 135 to either the primary output bus 134 or the complement output bus 136. The more significant portion switches (e.g., switches 9A-B, 10A-B, 11A-B, and 12A-B) include a common connection electrically connected to the drains of transistors 133 to either the primary output bus 134 or the complement output bus 136. The current source switches (e.g., switches 1A-B, 2A-B, 3A-B, and 4A-B) include a common electrical connection to connect the current sources 131*a-d* either to the sources of transistors 133 or to the less significant portion bus 132, which is connected to the sources of transistors 135.

The single-pole-double-throw switches may be "make-before-break" switches in which both of the two throw contacts are momentarily connected to the common pole contact connection for a predetermined time period as the switch transitions through an overlap region when changing state. The overlap region is generally established by controlling the complementary input voltages to the switch.

The less significant portion switches may connect the drains of transistors 135 to both the primary output bus 134 and the complement output bus 136 for the predetermined time period. The more significant portion switches may connect the drains of transistors 135 to both the primary output bus 134 and the complement output bus 136 for the predetermined time period. The input switches may connect sources 131*a-d* to both the sources of transistors 133 and the less significant portion bus 132, which is connected to the sources of transistors 135.

Because both throws of the switches are shorted together during bit transitions, current sources such as 131*a-d* will have sufficient voltage compliance to maintain the current at the same level as in steady state. The switching waveforms to the SPDT switches can be further engineered to minimize undue voltage excursions. This helps to minimize any glitches at the output of the DAC and enables the DAC to have a faster conversion time.

Transistors 133 act as cascode devices to the current sources 131*a-d*. Cascoding helps to increase the output impedance of the current sources. A higher output impedance will minimize variation in the output currents on busses 134 and 136 (e.g., Iout) as the voltage at these nodes change. Transistors 135 may be a replica (e.g., equivalent current density and/or similar position in the topology of the circuit) of transistors 133 and function as a current splitter to divide one MSB current to several LSB values. In this example, each LSB is one fourth of a MSB.

Transistors 133 in the more significant portion and transistors 135 in the less significant portion are of the same type. The current sources 131*a-d* may be implemented using transistors. Example types include n-channel transistors or p-channel transistors. The transistors may be metal oxide semiconductor field-effect transistors (MOSFETs), another type of field-effect transistors (FETs), or bipolar junction transistors (BJT), but both transistors 133 and transistors 135 are the same type (e.g., p-type or n-type).

However, transistors 133 may have a different area than transistors 135. Specifically, transistors 133 include a channel having a greater width than a channel of transistors 135. The wider channel is to account for more current that flows through the more significant portion of the DAC 105 as compared to the least significant portion. The channel width ratio between transistors in the most and least significant portions of the DAC is a function of how the DAC's input word is segmented. Specifically, the width ratio is $2^L:1$. In the 4-bit example discussed above, L=2, therefore the channel width ratio is $2^2=4:1$. That is, the channel of transistors 133 is four times wider than the channels of transistors 135.

The currents from the transistors are additive. Currents from sources 131*a-d* may flow through both the more-significant portion and the least significant portion and be added together at the output buses 134 and 136. The job of the current source switches, 1A-B, 2A-B, 3A-B, 4A-B, least significant portion switches, 5A-B, 6A-B, 7A-B, 8A-B, and most significant portion switches 9A-B, 10A-B, 11A-B, 12A-B as a whole is to steer all or portion of the total available current from the sources 131*a-d* to output bus 134 and the complement of the total available current to output bus 136. As such, the sum of the output currents at buses 134 and 136 is a constant and is equal to the total available current from sources 131*a-d*. To illustrate further using the 4-bit DAC example, consider an input value of 7 (e.g., 0111), which decoded in accordance with LUT 110 produces an output value of 000101110010 for P12, P11, P10, . . . , and P1 respectively. With P4, P3, P2, P1=0010, source current switches 4B, 3B, 2A, and 1B are turned on. With P8, P7, P6, P5=0111, switches 8B, 7A, 6A, and 5A in the least significant portion of the DAC 105 are turned on. And with P12, P11, P10, P9=0001, switches 12B, 11B, 10B, and 9A in the most significant portion of the DAC 105 are turned on. Given the above switch settings, four units of current from the most significant portion, plus three units of current from the least significant portion flow to the output bus 134. At the same time 9 units of current flow to the complement output bus 136.

The inherently monotonic behavior can now be more effectively explained according to FIGS. 3 and 4. As the input value (left column in LUT 110) changes from 1 through 4, P1=1 is maintained indicating that switch 1A in FIG. 4 is on for any of these four input values, and is directing the current from source 131*d* to bus 132. In addition, P5, P6, P7 and P8 progressively become 1 through these 4 input values. This causes switches 5A, 6A, 7A and 8A to progressively turn on thus increasing the current output at 134 one LSB at each step. When the input value changes from 4 to 5, there is a major carry transition meaning that the L=2 bits in the least significant section have gone through all possible combinations (in this example $2^L=4$) and a bit change in the most significant section is taking place.

In conventional segmented DACs, there is potential for non-monotonic behavior at every major carry transition. This is because the least significant section's currents always come from a fixed or designated current source. However, in the embodiments described herein, the least significant section's current source is not fixed but changes as a function of the state of the bits in the most significant section. For code 5, i.e. input value=5, P1 becomes 0 and P2 becomes 1. Therefore, switches 1A and 2B are turned off and 1B and 2A are turned on. Thus, the right most current source 131*d*, in response, sources current to transistors 133 instead of bus 132 and transistors 135. However, the second from right source 131*c* now serves as the source for the least significant section.

Therefore, the output value on 134 builds on top of the value that was there when the input value was 4. Even if there is large mismatch in the current values of the four sources 131*a-d*, monotonicity at the output is guaranteed. Similar behavior can be expected at other major carry transition points as well, which are 8 to 9, and 12 to 13 in this example. To reiterate, the most significant section currents build up on the LSB steps ensuring an inherently monotonic transfer characteristic.

Accordingly, after the switching transients die out, i.e. in the steady state, the transfer characteristic is truly monotonic. In general, major carry transitions produce large output current glitches due to mismatched current propagation delays through changing circuit paths in the network of switches. In the architecture described herein, it is easy to notice that the path delays for the most significant section and the least significant section are identical. For example, for input value 4, the current path is through switch 1A, transistors 135 and switches 5A, 6A, 7A and 8A. When the input value changes from 4 to 5, the most significant section current path is through switch 1B, transistor 133 (whose width is four times as large as that of transistor 135 and carries four times as much current) and switch 9A. The least significant section current path is through switch 2A, transistor 135 and switch 5A. Thus, both the most and least significant sections' current paths have nominally the same delay. Any residual glitch may be further reduced by making all the switches to be make-before-break type.

Figure 5:
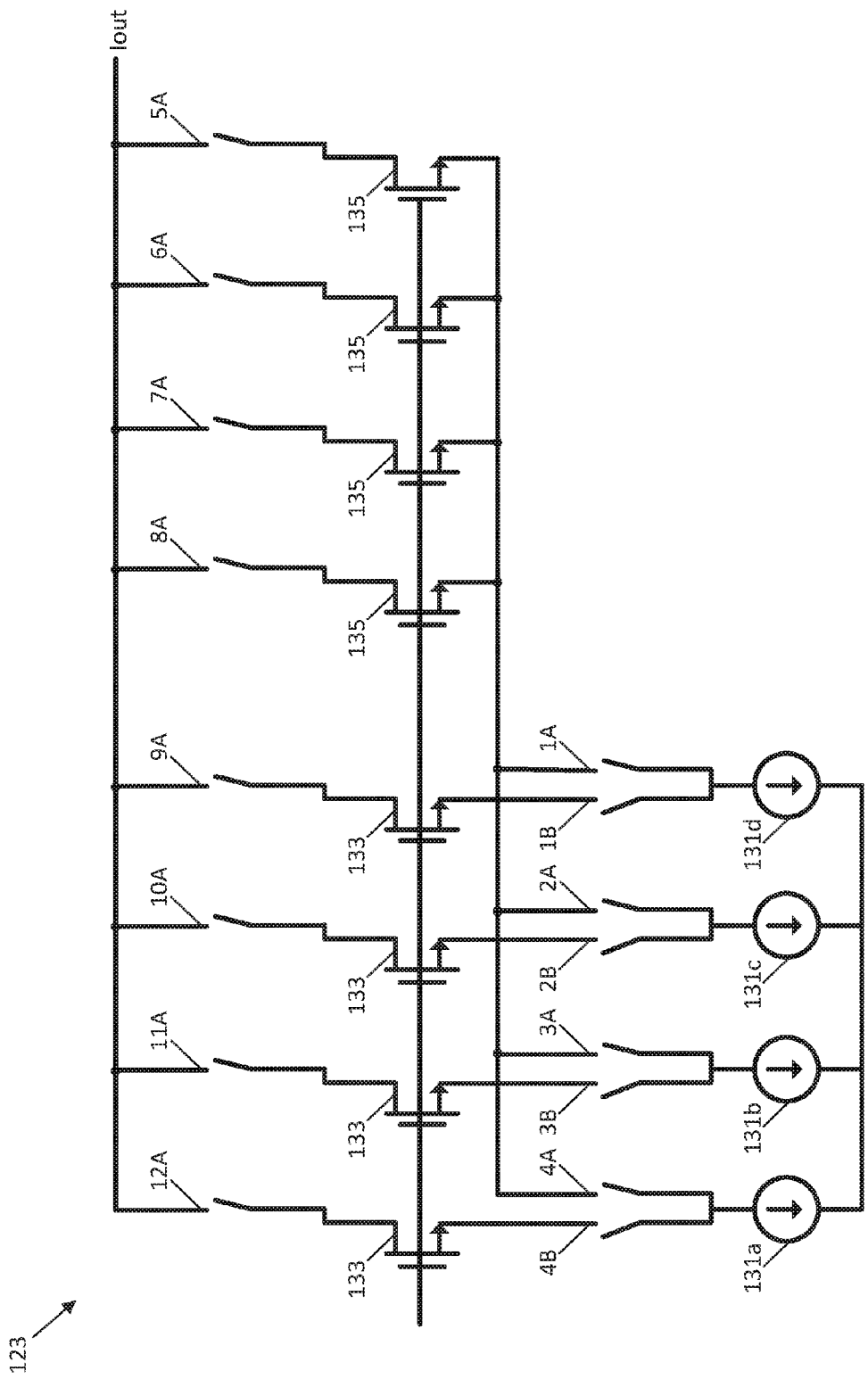
FIG. 5 illustrates another example monotonic segmented digital to analog converter.

FIG. 5 illustrates another example monotonic segmented digital to analog converter. In FIG. 5, no complement output or complement output bus 136 is included. The embodiment of FIG. 5 shares features described above regarding the operation of the circuit in FIG. 4 and the decoder described with reference to FIGS. 2 and 3. In addition, the circuits in both FIGS. 4 and 5 may demonstrate the following characteristics. The current at the analog output (Iout) is the sum of currents steered from the $2^M$ number of current sources 131*a-d* through the $2^M+2^L$ number of output switches (5A through 12A). M is the number of most significant bits, and L is the number of least significant bits in the input binary word. Each individual current source 131*a-d* supplies a total available current equaling to $2^L$ units of current, and each incremental unit of current is added to the analog output (Iout) as the input binary word is incremented by 1 least significant bit (LSB), or is subtracted from the analog output as the input binary word is decremented by 1 LSB. The maximum available current at the analog output is equal to the product of $2^M$ and $2^L$ units of current.

The specific instance of the $2^M$ number of current sources supplying incremental units of current to the analog output corresponding to changes within the plurality of least significant bits is not fixed. The specific instance of current source supplying incremental units of current to the analog output is different for each value of the plurality of most significant bits in the range of 0 to $2^M-1$. Every adjacent transition in the value of the least significant bits from $2^L-1$ to 0, or vice versa, results in a major carry transition in the value of the most significant bits, and the specific instance of current source supplying incremental units of current to the analog output remains unchanged for any change in the value of the input binary word that does not generate a major carry. Thus, the current at the analog output at a major carry transition builds on the total current supplied from the instance of current source corresponding to the previous value of the plurality of most significant bits immediately before the occurrence of the major carry transition.

Figure 6:
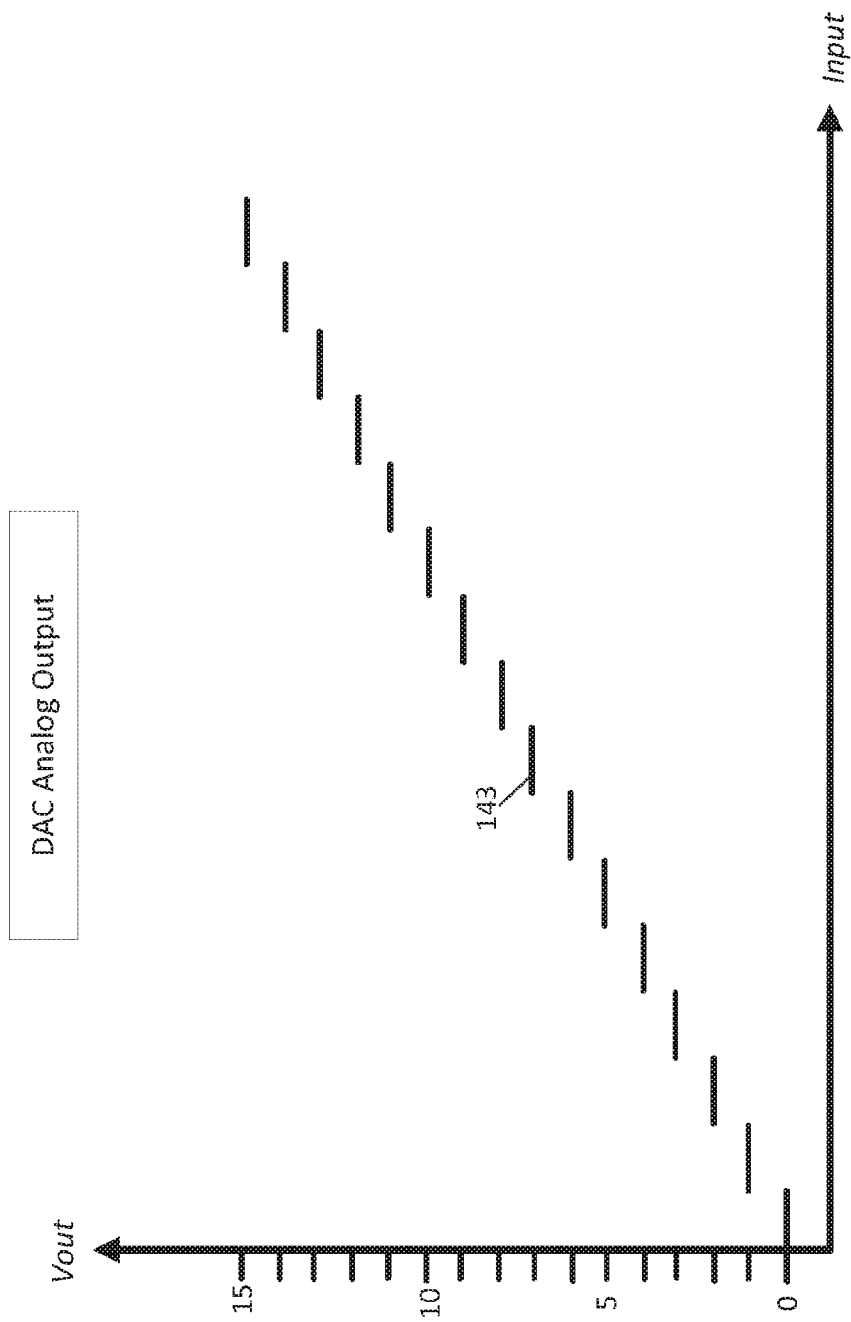
FIG. 6 illustrates an example output for the monotonic segmented digital to analog converter.

FIG. 6 illustrates an example output waveform of the monotonic DAC 105 as a function of its input binary word value. The output is an analog signal that may have a number of possible amplitude equal to the number of possible values for the binary word. A 4-bit binary word has sixteen possible values, and the output in FIGS. 6 and 7 has sixteen possible levels. The analog signal may be sampled at a predetermined interval to produce the constant levels or square wave function shown. FIG. 6 illustrates a count sequence 143 of binary word values (e.g., 0-1-2-3-4-5-6-7-8-9-10-11-12-13-14-15) for all possible predetermined output levels for the analog output signal. A quantity of the predetermined output levels may be equal to a product of $2^M$ and $2^L$, wherein M is a quantity of the most significant bits and L is a quantity of the least significant bits.

The DAC 105 may provide the output signal that represents the input signal to a variety of devices. The output signal may be sent to an audio system (e.g., speaker or earphones). The output signal may be amplified for a communication system and transmitted to another endpoint. Other applications are possible.

Figure 7:
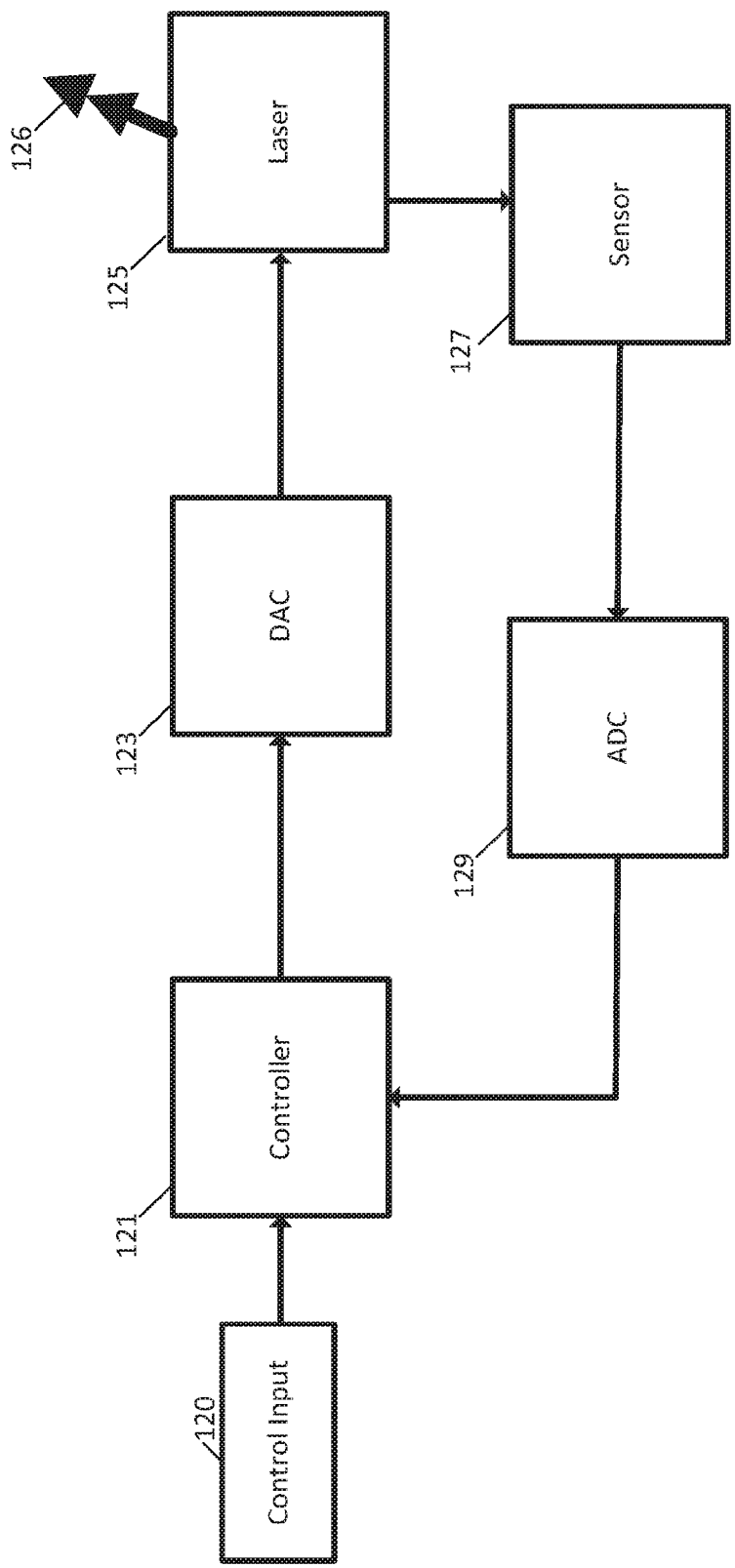
FIG. 7 illustrates a silicon photonic system including a monotonic segmented digital to analog converter.

FIG. 7 illustrates a silicon photonic system including a monotonic segmented digital to analog converter. The system includes a control input 120, a controller 121, and digital-to-analog converter (DAC) 123, a laser 125, a sensor 127, and an analog-to-digital (ADC) converter 129. Additional, different, or fewer components may be included.

In silicon photonic systems, a light output 126 of the laser 125 should be held substantially constant in spite of environmental changes. The sensor 127 is configured to measure environment changes or changes in the light output 126. The sensor 127 may be a sensor that measures the temperature of the laser 125. Alternatively, the sensor 127 may include a photodiode or current measurement circuit to monitor the light production of the laser 125.

As the temperature of the laser 125 is increased, the light output falls. Therefore, a compensation scheme may be used to keep the light output constant. A typical servo loop to accomplish this is shown in FIG. 7. The desired light setting is applied to a controller 121 as a digital word through the control input 120. The feedback input to the controller 121 is also a digital word that is representative of the light output of the laser. The light output may be described by an analog signal that is converted to the digital word by ADC 129. Alternatively, the temperature of the laser 125 may be measured by sensor 127 may be an analog signal that is converted to the digital word by ADC 129.

The output of the controller 121 is digital data that is applied to DAC 123. The DAC 123 may be in current mode. A current mode DAC produces current output, in contrast to voltage mode DAC that produces voltage output. The analog output of the DAC 123 is the current that ensures the light output of the laser is held constant as the temperature changes. In one example, an amplifier may be included in the DAC 123 for amplifying the low level analog output to a driving signal for the laser 125. For the servo loop to function properly, the transfer characteristic of the DAC should be monotonic. In other words, as the digital data that is applied to the DAC is moving in one direction (increasing or decreasing), the analog output should also move in the same direction. If for any reason, there are regions in the transfer characteristic where the behavior is non-monotonic, the loop may become unstable. In certain applications, the DAC 123 may be incorporated into the controller 121.

Figure 8:
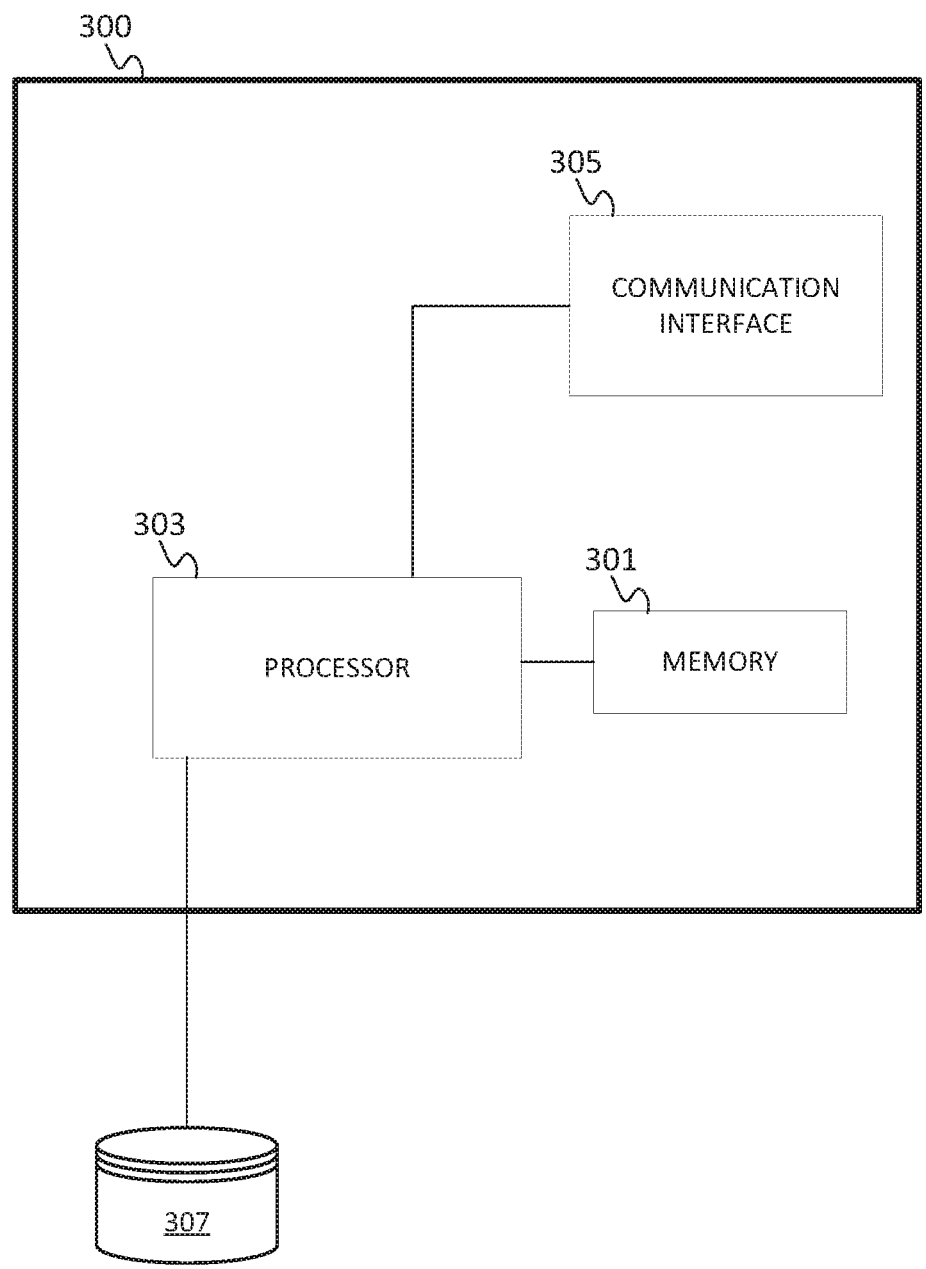
FIG. 8 illustrates an example controller for the silicon photonic system of FIG. 7.
Figure 9:
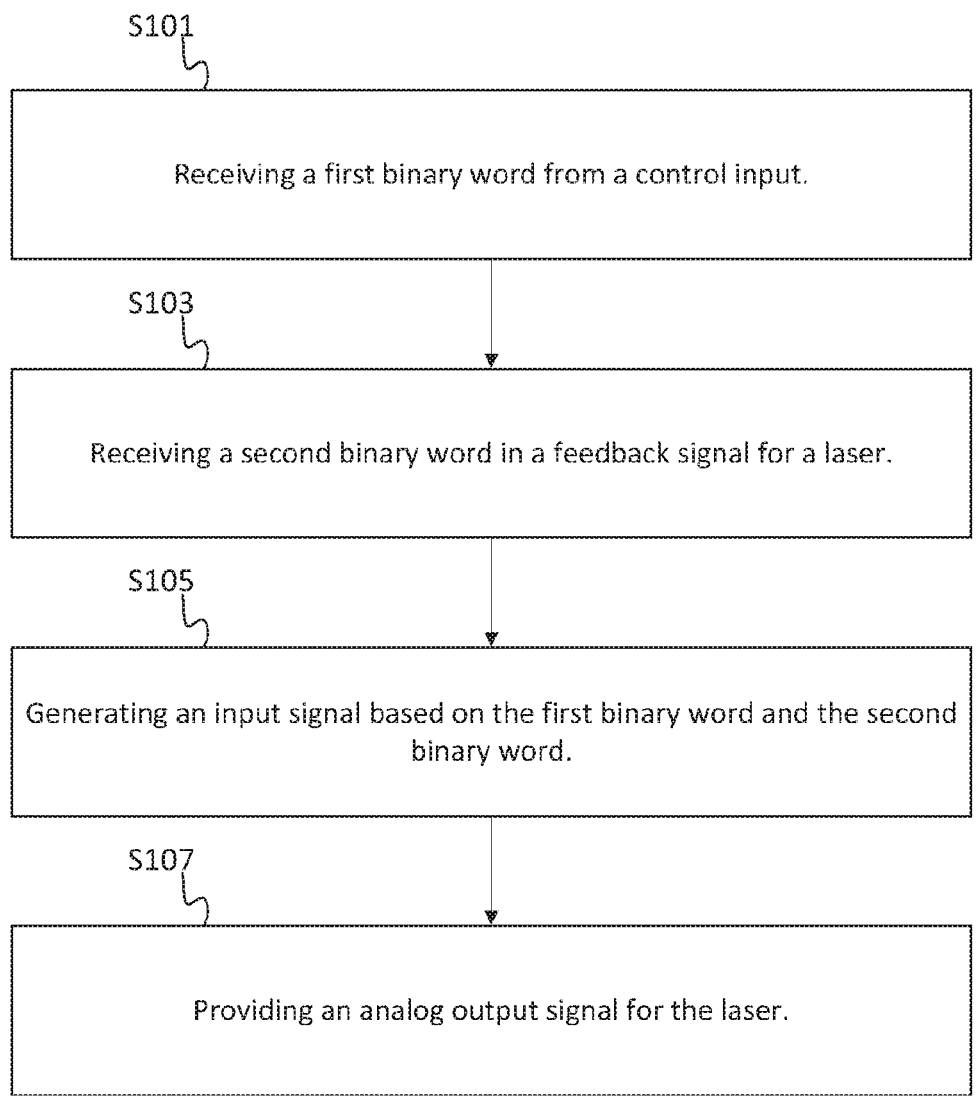
FIG. 9 illustrates an example flowchart for the operation of the computing device of FIG. 8.

FIG. 8 illustrates an example controller 300 for the silicon photonic system of FIG. 7. The controller 300 may correspond to controller 121. The controller 300 includes at least a memory 301, a controller 303, and a communication interface 305. Additional, different, or fewer components may be provided. FIG. 9 illustrates an example flowchart for the silicon photonic control system. Additional, different, or fewer acts may be provided. The acts are performed in the order shown or other orders. The acts may also be repeated. Instructions for carrying out the acts may be embodied on a non-transitory computer readable medium.

At act S101, the communication interface 305 or controller 300 receives a first binary word from the control input 120. The first binary word may describe data to be communicated by the laser 125. The data may include a series of binary words.

At act S103, the communication interface 305 or controller 300 receives a feedback signal representing a second binary word indicative of ambient conditions of a laser or output of the laser. The ambient conditions may include one or more of temperature, humidity, pressure, or turbidity measured by sensor 127. The turbidity of the air that the light 126 travels through is a measure of particles suspended in the air through which the light 126 is traveling. The pressure may be the air pressure in a chamber through with the light 126 is traveling. The output of the laser may be the intensity of the light 126 produced by the laser 125 or an electric quantity (e.g., voltage, power, or current) of the signal driving the laser 125.

At act S105, the controller 300 generates an input signal based on the first binary word and the second binary word. The first binary word includes a plurality of most significant bits and a plurality of least significant bits, and the input signal includes a bit width equal to or greater than three times a bit width of the first binary word. For example, when the first binary word from the control input 120 is 8 bits, the input signal includes 24 bits. Output switches and source switches in the DAC 123 are set according to the input signal. The output switches may include a pair of switches for each state of the most significant bits and a pair of switches for each state of the least significant bits. The plurality of source switches includes a pair of switches for each of the plurality of most significant bits and for each of the plurality of least significant bits.

At act S107, the controller 300 or DAC 123 provides an output signal for the laser. The controller 300 may provide a digital analog signal for the laser, which is converted to an analog output signal by the DAC 123. The controller 300 and the DAC 123 may be combined into a single device.

The processor 303 may include a general processor, digital signal processor, an application specific integrated circuit (ASIC), field programmable gate array (FPGA), analog circuit, digital circuit, combinations thereof, or other now known or later developed processor. The processor 303 may be a single device or combinations of devices, such as associated with a network, distributed processing, or cloud computing.

The memory 301 may be a volatile memory or a non-volatile memory. The memory 301 may include one or more of a read only memory (ROM), random access memory (RAM), a flash memory, an electronic erasable program read only memory (EEPROM), or other type of memory. The memory 301 may be removable from the network device 300, such as a secure digital (SD) memory card.

While the computer-readable medium may be shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

We claim:

1. A method comprising:
   receiving an input analog signal indicative of a light output of a laser;
   determining an input binary word, wherein the input binary word includes a plurality of most significant bits and a plurality of least significant bits;
   decoding the input binary word to an intermediate value including a bit width equal to or greater than a bit width of the input binary word;
   setting a plurality of output switches according to the intermediate value, wherein the plurality of output switches includes one or more switches for states of the plurality of most significant bits and one or more switches for states of the plurality of least significant bits; and
   providing an analog output signal that represents the input binary word, wherein the analog output signal is controlled by the plurality of output switches.

2. The method of claim 1, wherein the input analog signal describes a light intensity of the light output of the laser.

3. The method of claim 1, wherein the input analog signal describes a temperature of the light output of the laser.

4. The method of claim 1, further comprising:
   setting a plurality of current source switches according to the intermediate value, wherein the plurality of current source switches includes one or more switches for states of the plurality of most significant bits.

5. The method of claim 1, wherein the input analog signal is a feedback signal based on a previous setting for the laser.

6. The method of claim 1, further comprising:
querying a lookup table using the input binary word.

7. The method of claim 6, wherein a bit width of the intermediate value that is output from the decoder is (2×2M+2L), wherein M is a quantity of the most significant bits and L is a quantity of the least significant bits.

8. The method of claim 6, further comprising:
receiving, from the lookup table, the intermediate signal including the bit width equal to or greater than three times the bit width of the input binary word.

9. An apparatus comprising:
a communication interface configured to receive an input analog signal indicative of a light output of a laser;
a controller configured to determine an input binary word including a plurality of most significant bits and a plurality of least significant bits and decode the input binary word to an intermediate value including a bit width equal to or greater than a bit width of the input binary word; and
a plurality of output switches set according to the intermediate value, wherein the plurality of output switches includes one or more switches for states of the plurality of most significant bits and one or more of switches for states of the plurality of least significant bits.

10. The apparatus of claim 9, wherein the controller is configured to provide an analog output signal that represents the input binary word, wherein the analog output signal is controlled by the plurality of output switches.

11. The apparatus of claim 9, wherein the input analog signal describes a light intensity of the light output of the laser.

12. The apparatus of claim 9, further comprising:
a sensor configured to measure an ambient condition of the laser, wherein the input analog signal describes the ambient condition of the laser.

13. The apparatus of claim 12, wherein the ambient condition is temperature, humidity, pressure, or turbidity.

14. The apparatus of claim 10, wherein the controller is configured to set a plurality of current source switches according to the intermediate value, wherein the plurality of current source switches includes one or more switches for states of the plurality of most significant bits.

15. The apparatus of claim 10, wherein the input analog signal is a feedback signal based on a previous setting for the laser.

16. The apparatus of claim 10, further comprising:
a memory configured to store a lookup table, wherein the processor queries the lookup table using the input binary word.

17. The apparatus of claim 10, wherein a bit width of the intermediate value is (2×2M+2L), wherein M is a quantity of the most significant bits and L is a quantity of the least significant bits.

18. The apparatus of claim 10, wherein the analog output signal is based on a monotonic transfer characteristic.

19. A non-transitory computer readable medium including instructions that when executed cause a processor to perform:
receiving an input analog signal indicative of a light output of a laser;
determining an input binary word having one or more most significant bits and one or more least significant bits;
calculating an intermediate value from the input binary word, wherein the intermediate value includes a bit width equal to or greater than a bit width of the input binary word; and
setting a plurality of output switches according to the intermediate value, wherein the plurality of output switches includes one or more switches for states of the plurality of most significant bits and one or more switches for states of the plurality of least significant bits.

20. The non-transitory computer readable medium of claim 19, wherein the input analog signal describes a light intensity of the light output of the laser or an ambient condition of the laser.

* * * * *